US010529535B2

(12) United States Patent
Atzmony et al.

(10) Patent No.: US 10,529,535 B2
(45) Date of Patent: *Jan. 7, 2020

(54) CALIBRATED ENERGY TRANSFER

(71) Applicant: Goji Limited, Hamilton (BM)

(72) Inventors: Daniella Atzmony, Shoham (IL); Eran Ben-Shmuel, Savyon (IL); Steven Robert Rogers, D.N. Emek Sorek (IL); Amichai Ron, Jerusalem (IL); Daniel Selinger, Tel-Aviv (IL); Eyal Torres, Savyon (IL)

(73) Assignee: GOJI LIMITED, Hamilton (BM)

( * ) Notice: Subject to any disclaimer, the term of this patent is extended or adjusted under 35 U.S.C. 154(b) by 1422 days.

This patent is subject to a terminal disclaimer.

(21) Appl. No.: 14/262,246

(22) Filed: Apr. 25, 2014

(65) Prior Publication Data

US 2014/0232274 A1    Aug. 21, 2014

Related U.S. Application Data

(63) Continuation of application No. 12/984,305, filed on Jan. 4, 2011, now Pat. No. 8,742,306.

(51) Int. Cl.
*H02J 50/12* (2016.01)
*H02J 50/20* (2016.01)
(Continued)

(52) U.S. Cl.
CPC ............ *H01J 37/241* (2013.01); *H02J 17/00* (2013.01); *H02J 50/12* (2016.02); *H02J 50/20* (2016.02);
(Continued)

(58) Field of Classification Search
CPC .......... H01J 37/241; H02J 17/00; H02J 50/12; H02J 50/20; H02J 50/30; H02J 50/00;
(Continued)

(56) References Cited

U.S. PATENT DOCUMENTS 4,149,056 A    4/1979 Kaneshiro et al.
4,162,381 A    7/1979 Buck
(Continued)

FOREIGN PATENT DOCUMENTS

EP    2 326 142    5/2011
WO    WO 2008/102334 A1    8/2008
(Continued)

OTHER PUBLICATIONS

International Search Report and Written Opinion dated May 30, 2012 for PCT Application No. PCT/US2012/020151, 10 pages.

*Primary Examiner* — Michael G Hoang
(74) *Attorney, Agent, or Firm* — Finnegan, Henderson, Farabow, Garrett & Dunner, LLP

(57) ABSTRACT

Apparatuses, methods, kits, and systems relating to transferring electromagnetic energy to an energy application zone via a source of electromagnetic energy are disclosed. Some apparatuses may include a processor configured to determine a preliminary amount of energy to be dissipated in an object located at least partially in the energy application zone and determine a corrected amount of energy based on the preliminary amount of energy and calibration information. The processor may be further configured to estimate an amount of energy dissipated in the object. The processor may also be configured to cause the source to transfer energy to the energy application zone at least until the energy dissipated in the object as estimated equals the corrected amount of energy.

20 Claims, 7 Drawing Sheets

(51) Int. Cl.

| | |
|---|---|
| *H02J 50/30* | (2016.01) |
| *H02J 50/80* | (2016.01) |
| *H02J 50/90* | (2016.01) |
| *H02J 50/00* | (2016.01) |
| *H05B 6/64* | (2006.01) |
| *H05B 6/68* | (2006.01) |
| *H01J 37/24* | (2006.01) |
| *H02J 17/00* | (2006.01) |
| *H05B 6/70* | (2006.01) |

(52) U.S. Cl.
CPC .............. *H02J 50/30* (2016.02); *H02J 50/80* (2016.02); *H02J 50/90* (2016.02); *H05B 6/6441* (2013.01); *H05B 6/68* (2013.01); *H05B 6/701* (2013.01); *H05B 6/705* (2013.01); *Y02B 40/143* (2013.01); *Y02B 40/146* (2013.01)

(58) Field of Classification Search
CPC ........ H02J 50/80; H02J 50/90; H05B 6/6441; H05B 6/68; H05B 6/705; H05B 6/701; Y02B 40/143; Y02B 40/146
USPC ........... 219/121.63, 678, 704, 709–712, 744; 250/492.1; 426/231, 233; 99/333, 451
See application file for complete search history.

(56) References Cited

U.S. PATENT DOCUMENTS

| | | | |
|---|---|---|---|
| 5,521,360 A | * | 5/1996 | Johnson ................ H05B 6/686 219/709 |
| 5,812,393 A | | 9/1998 | Drucker |
| 5,883,801 A | | 3/1999 | Drucker et al. |
| 6,198,975 B1 | | 3/2001 | Drucker et al. |
| 6,249,710 B1 | | 6/2001 | Drucker et al. |
| 6,681,137 B1 | | 1/2004 | Drucker et al. |
| 7,060,953 B2 | | 6/2006 | Ishikawa et al. |
| 7,723,655 B2 | | 5/2010 | Kim |
| 2005/0091996 A1 | | 5/2005 | Ishikawa et al. |
| 2006/0231551 A1 | | 10/2006 | Ruther et al. |
| 2007/0210077 A1 | | 9/2007 | Goldshalk et al. |
| 2009/0045191 A1 | | 2/2009 | Ben-Shmuel et al. |
| 2009/0057302 A1 | | 3/2009 | Ben-Shmuel et al. |
| 2009/0236334 A1 | | 9/2009 | Ben-Shmuel et al. |
| 2009/0321429 A1 | | 12/2009 | Hyde et al. |
| 2010/0115785 A1 | | 5/2010 | Ben-Shmuel et al. |
| 2011/0168699 A1 | | 7/2011 | Oomori et al. |

FOREIGN PATENT DOCUMENTS

| | | |
|---|---|---|
| WO | WO 2009/104191 A2 | 8/2009 |
| WO | WO 2010/032345 A1 | 3/2010 |
| WO | WO 2010/052723 A1 | 5/2010 |
| WO | WO 2010/052724 A2 | 5/2010 |
| WO | WO 2010/052725 A2 | 5/2010 |

* cited by examiner

CALIBRATED ENERGY TRANSFER

CROSS REFERENCE TO RELATED APPLICATION(S)

This application is a continuation of and claims the benefit of priority to U.S. patent application Ser. No. 12/984,305, filed Jan. 4, 2011 (now allowed). The entire contents of the above referenced application is expressly incorporated herein by reference.

TECHNICAL FIELD

The present application relates to apparatuses, methods, kits, and systems for applying electromagnetic energy to an object.

BACKGROUND

Electromagnetic waves may be used to apply energy to an object. For example, such an object may be placed in a cavity of a device configured to transfer electromagnetic energy to the cavity from a source of electromagnetic energy. The source of electromagnetic energy can be activated such that electromagnetic radiation is transferred to the cavity, and thus, some of the energy of that radiation may be dissipated in the object. In some cases, it may be desirable to dissipate a particular amount of energy in the object. For example, through dissipation of a particular amount of energy in the object, various properties or characteristics associated with the object may be adjusted or altered. Values for various parameters associated with the energy delivery process (e.g., a length of time of energy delivery, a power level of radiation incident upon the object, etc.) may be selected with the intent of providing a desired set of properties or characteristics in the object either during processing or upon completion of an electromagnetic energy transfer process.

Many factors can result in variations in energy delivery and dissipation. Each source of variation can potentially yield unexpected and undesirable results. Thus, there is a need for an apparatus and method that can at least partially account for such variations in an electromagnetic energy delivery process.

SUMMARY

Some exemplary aspects of the disclosure may be directed to an apparatus for transferring electromagnetic energy to an energy application zone via a source of electromagnetic energy. The apparatus may include a processor configured to determine a preliminary amount of energy to be dissipated in an object located at least partially in the energy application zone. The processor may further be configured to determine a corrected amount of energy based on the preliminary amount of energy and calibration information. The processor may also be configured to determine an amount of delivered energy, based on an amount of energy returned from the energy application zone and an amount of energy supplied to the energy application zone. The processor may be further configured to cause the source to transfer energy to the energy application zone at least until the amount of delivered energy equals the corrected amount of energy.

Other exemplary aspects of the disclosure may include an apparatus for transferring electromagnetic energy to an energy application zone via a source of electromagnetic energy. The apparatus may include a processor configured to determine a target amount of energy to be dissipated in an object located at least partially in the energy application zone. The processor may also be configured to determine an estimated amount of energy dissipated in the object based on primary calibration information, an amount of energy returned from the energy application zone, and an amount of energy supplied to the energy application zone. The processor may be further configured to cause the source to transfer energy to the energy application zone at least until the estimated amount of energy equals the target amount of energy.

Other exemplary aspects of the disclosure may include an apparatus for transferring electromagnetic energy to an energy application zone via a source of electromagnetic energy. The apparatus may include a processor configured to determine a preliminary amount of energy to be dissipated in an object located at least partially in the energy application zone. The processor may also be configured to determine a corrected amount of energy based on the preliminary amount of energy and calibration information. The processor may also be configured to estimate the amount of energy dissipated in the object, and cause the source to transfer energy to the energy application zone at least until the energy dissipated in the object as estimated equals the corrected amount of energy.

Other exemplary aspects of the disclosure may include a method of operating an apparatus for delivering electromagnetic energy to an energy application zone. The method may include determining a preliminary amount of energy to dissipate in an object located at least partially in the energy application zone and determining a corrected amount of energy based on the preliminary amount of energy and calibration information. The method may further include detecting an amount of energy returned from the energy application zone, determining an amount of delivered energy, based on the amount of energy returned from the energy application zone and an amount of energy supplied to the energy application zone, and causing the source to transfer energy to the energy application zone at least until the amount of delivered energy equals the corrected amount of energy.

Other exemplary aspects of the disclosure may include a kit for calibrating an apparatus for transferring electromagnetic energy. The kit may include at least one standard object and information regarding use of the at least one standard object to calibrate the apparatus, wherein at least a portion of the information is encoded on one or more machine readable elements.

Other exemplary aspects of the disclosure may be directed to a system that includes at least one standard object associated with at least one machine readable element and an energy delivery device. The energy delivery device may include an energy application zone and a source configured to transfer electromagnetic energy to the energy application zone. The energy delivery device may further include a processor configured to determine a preliminary amount of energy to dissipate in an object located at least partially in the energy application zone; determine a corrected amount of energy based on the preliminary amount of energy and calibration information; cause the source to transfer a first amount of energy to the energy application zone; determine an amount of delivered energy, based on an amount of energy returned from the energy application zone and the first amount of energy; and cause the source to transfer energy to the energy application zone at least until the amount of delivered energy equals the corrected amount of energy. The processor may further be configured to execute a selftest of the energy delivery device and determine at least a portion of the calibration information based on the selftest. The system may further include a reading device configured to recognize the at least one machine readable element and trigger the processor to execute the selftest upon recognition of the at least one machine readable element.

Other exemplary aspects of the disclosure may be directed to a system comprising at least one standard object associated with at least one machine readable element; and an energy delivery device. The energy delivery device may include an energy application zone; a source configured to transfer electromagnetic energy to the energy application zone; and a processor. The processor may be configured to determine a preliminary amount of energy to be dissipated in an object located at least partially in the energy application zone. The processor may also be configured to determine a corrected amount of energy based on the preliminary amount of energy and calibration information. The processor may also be configured to cause the source to transfer a first amount of energy to the energy application zone; determine an amount of delivered energy, based on an amount of energy returned from the energy application zone and the first amount of energy; and cause the source to transfer energy to the energy application zone at least until the amount of delivered energy equals the corrected amount of energy. The system may further include a reading device configured to recognize the at least one machine readable element and trigger the processor to execute a selftest upon recognition of the at least one machine readable element. In some embodiments, the reading device may be configured to recognize the at least one machine readable element associated with a standard object when the standard object is positioned in the energy application zone. In some embodiments, the at least one machine readable element comprises at least one of a RFID tag and a barcode.

The preceding summary is intended to provide a brief summary of just a few aspects of the disclosure and is not intended to restrict, in any way, the scope of the claims. In addition, it is to be understood that both the foregoing general description and the following detailed description are exemplary and explanatory only and are not restrictive of the claims.

BRIEF DESCRIPTION OF THE DRAWINGS

The accompanying drawings, which are incorporated in and constitute a part of this specification, illustrate various embodiments and exemplary aspects of the present disclosure. In the drawings.

DESCRIPTION OF EXEMPLARY EMBODIMENTS

Reference will now be made in detail to some embodiments of the disclosed technology, examples of which are illustrated in the accompanying drawings. When appropriate, the same reference numbers are used throughout the drawings to refer to the same or like parts.

Figure 1:
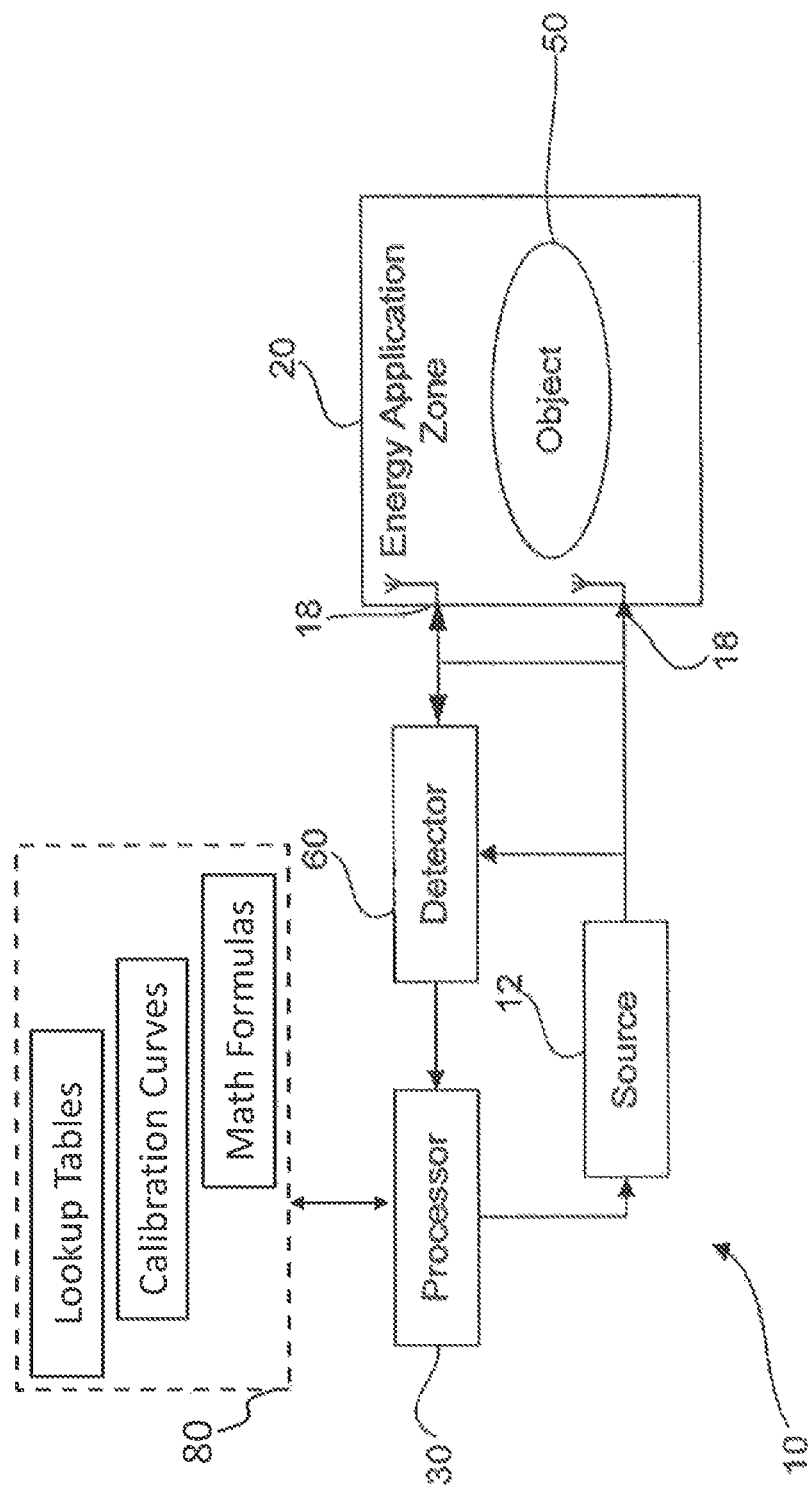
FIG. 1 is a diagrammatic representation of an apparatus for applying electromagnetic energy to an object, in accordance with an exemplary embodiment.

Embodiments of the invention may involve apparatuses, methods, kits, and systems for applying electromagnetic energy to an object in an energy application zone. FIG. 1 illustrates an exemplary embodiment of an apparatus 10 for delivering electromagnetic energy to an object 50. Apparatus 10 may include an energy application zone 20, a source 12 configured to supply electromagnetic energy to energy application zone 20, a detector 60 configured to detect energy delivered to and/or returned from energy application zone 20, and at least one processor 30.

The term electromagnetic energy, as used herein, includes any or all portions of the electromagnetic spectrum, including but not limited to, radio frequency (RF), infrared (IR), near infrared, visible light, ultraviolet, etc. In some cases, applied electromagnetic energy may include RF energy, such as, for example, microwave and ultra high frequency (UHF) energy. Some embodiments may include RF energy with a wavelength of 100 km to 1 mm, which is a frequency of 3 KHz to 300 GHz. In some cases, RF energy within a narrower frequency range, e.g., 800 MHz-1 GHz, may be applied.

The electromagnetic energy delivery apparatuses, methods, kits, and systems disclosed herein are not limited to heating applications. For example, while the disclosure includes a number of examples of electromagnetic energy used for heating, these examples are provided merely to illustrate exemplary principles. The apparatuses and methods described and claimed herein may provide benefit for various industrial, commercial, and consumer products and processes involving the application of energy, regardless of whether the application of energy results in a temperature rise. For example, electromagnetic energy may be applied to load 40 for heating, combusting, thawing, defrosting, cooking, drying, accelerating reactions, expanding, evaporating, fusing, causing or altering biologic processes, medical treatments, preventing freezing or cooling, maintaining object 50 or a portion thereof within a desired temperature range, or any other application where it is desirable to apply energy.

Source 12, as shown in FIG. 1, may include any component or components suitable for generating and transferring electromagnetic energy to energy application zone 20. Transferring electromagnetic energy may also be referred to herein as supplying or applying electromagnetic energy. In certain embodiments, source 12 may include one or more power supplies, modulators, amplifiers, and radiating elements 18 configured to generate and transfer electromagnetic energy to energy application zone 20. As used herein, the term radiating element may broadly refer to any structure from which electromagnetic energy may radiate and/or be received, regardless of whether the structure was originally designed for purposes of radiating or receiving energy, and regardless of whether the structure serves any additional function. Electromagnetic energy may be transferred to energy application zone 20 in the form of electromagnetic waves (also known as electromagnetic radiation) at predetermined wavelengths or frequencies. Electromagnetic waves may include propagating waves, resonating waves, evanescent waves, and/or waves that travel through a medium in any other manner.

In certain embodiments, source 12 may supply incident energy to one or more radiating elements 18 functioning as transmitters. These radiating elements 18, in turn, convert at least a portion of this incident energy into energy delivered to energy application zone 20. This delivered energy may also be referred to as energy supplied to energy application zone 20. Of the delivered energy, a portion may be dissipated in object 50. This portion of the delivered energy dissipated in object 50 may be referred to as dissipated or absorbed energy. Another portion of the delivered energy may be returned from energy application zone 20. This returned energy may include, for example, delivered energy that is reflected and received by one or more radiating elements 18 functioning as receivers. Reflected energy may include, for example, energy reflected back to one or more receivers by object 50 and/or any structures, elements, or features of energy application zone 20. Reflected energy may also include energy reflected at the interface between radiating elements 18 and zone 20 (e.g., energy that is reflected directly at the antenna and that is not transferred to zone 20). Returned energy may also include a portion of the transferred energy that is transmitted from one radiating element 18 to another (e.g., through direct interaction).

As used herein, an energy application zone 20 may include any void, location, region, or area where electromagnetic energy may be applied. It may include a hollow, or may be filled or partially filled with liquids, solids, gases, or combinations thereof. By way of example, an energy application zone 20 may include the interior of an enclosure, interior of a partial enclosure (e.g., conveyor belt oven), interior of a conduit, open space, solid, or partial solid, which allows for the existence, propagation, and/or resonance of electromagnetic waves. Energy application zone 20 may be permanent or may be temporarily constituted for purposes of energy application. For ease of discussion, energy application zone 20 may alternatively be referred to as a cavity, with the understanding that the term cavity implies no particular physical structure other than an area in which electromagnetic energy may be applied.

Energy application zone 20 may be located in an oven, chamber, tank, dryer, thawer, dehydrator, reactor, engine, chemical or biological processing apparatus, incinerator, material shaping or forming apparatus, conveyor, combustion zone, or any area where it may be desirable to apply energy. In some embodiments, the electromagnetic energy application zone 20 may include an electromagnetic resonator (also known as a cavity resonator, a resonant cavity, or a cavity).

The configuration of elements of energy application zone 20 may be predetermined or the configuration may be otherwise determinable, so long as physical aspects of the structure of energy application zone 20 are known at a time of energy delivery. Energy application zone 20 may assume any shape that permits electromagnetic wave propagation therein. Energy application zone 20 may also assume various degrees of closure, such as, for example, closed (e.g., completely enclosed by conductor materials), bounded at least partially, open (e.g., having non-bounded openings), etc. The general methodology of this disclosure is not limited to any particular cavity shape, configuration, or degree of closure, although in some applications, a high degree of closure may be preferred.

For purposes of this disclosure, the term object is not limited to a particular form, and although it is in the singular, it may include multiple, separate items, parts, or components. Object 50 may comprise any matter to which there is a desire to transfer a particular amount of electromagnetic energy. Object 50 may include matter of any state, e.g., solid, liquid, gas, and may include composites or mixtures of matter in one or more differing states and/or transitioning between one or more states. By way of non-limiting example, object 50 may include such matter as food to be thawed or cooked; clothes or other material to be dried; frozen material (e.g., organs) to be thawed; chemicals to be reacted; fuel or other combustible material to be to be combusted; hydrated material to be dehydrated; gases to be expanded; liquids to be thawed, heated, boiled, or vaporized; blood or blood components (e.g., blood plasma or red blood cells) to be thawed and/or warmed; materials to be manufactured; components to be connected; or any other material into which electromagnetic energy may be transferred. Object 50 may comprise one or more constituents. Such object constituents may include one or more parts, portions, or components of object 50. For example, an object 50 may include a liquid constituent, gaseous constituent, and/or a solid constituent.

Various sources of energy loss may be associated with apparatus 10. Such loss constituents may include, for example, any sources of energy loss associated with energy application zone 20. For example, loss constituents may include any window, opening, crack, leak, void, hole, location, region, or area where electromagnetic energy may escape from energy application zone 20. Loss constituents may also include, for example, any matter other than object 50 in, on, or associated with energy application zone 20 into which electromagnetic energy may be dissipated. For example, loss constituents may include trays, racks, turntables, receptacles, or any other structures or elements associated with energy application zone 20. Loss constituents may also include packaging associated with object 50. Furthermore, loss constituents may include matter remaining in energy application zone 20 as a result of prior energy application processes. Such remaining matter may constitute residual portions of a previous object 50, and may include large portions of the previous object 50, as well as smaller portions, such as, for example, remnants, fragments, traces, scraps, residue, crumbs, stains, or buildup on portions of energy application zone 20.

Apparatus 10 may also include one or more processors 30 configured to control delivery of electromagnetic energy to object 50. For purposes of this disclosure, a processor may include any electrical circuit configured to execute one or more instructions. For example, processor 30 may include one or more integrated circuits, microchips, microcontrollers, microprocessors, all or part of a central processing unit (CPU), graphics processing unit (GPU), digital signal processors (DSP), field-programmable gate array (FPGA) or other circuit suitable for executing instructions or performing logic operations.

If more than one processor 30 is employed, all may be of similar construction, or they may be of differing construction. Multiple processors 30 may be separate circuits electrically connected or independent from one another, or they may be or integrated together in a single circuit. When more than one processor 30 is used, they may be configured to operate independently or collaboratively. They may be coupled electrically, magnetically, optically, acoustically, mechanically, wirelessly or in any other way permitting at least one signal to be communicated between them.

Processor 30 may be configured for a particular use, or can be configured for general-purpose use and perform different functions by executing different software. Accordingly, processor 30 may provide a single function or may provide multiple functions. For example, processor 30 may regulate source 12 and may also be integrated into a control circuit that provides additional control functions to components other than source 12.

Instructions to be executed by processor 30 may be provided by a variety of sources. For example, instructions may be pre-loaded into the processor 30 or may be stored in a separate memory unit such as a RAM, a ROM, a hard disk, an optical disk, a magnetic medium, a flash memory, other permanent, fixed, or volatile memory, or any other mechanism capable of storing instructions for processor 30.

In some embodiments, processor 30 may be configured to receive information from one or more detectors 60. Detector 60 may be configured to detect signals associated with electromagnetic waves received by the one or more radiating elements 18. Detector 60 may comprise one or more electric circuits configured to measure, sense, monitor, etc. at least one parameter associated with an electromagnetic wave. For example, detector 60 may include a power meter configured to detect a level of incident power, delivered power, and/or returned power. In some embodiments, detector 60 may include a directional and/or a bi-directional coupler configured to allow signals to flow from source 12 to radiating elements 18 when radiating elements 18 function as transmitters, and to allow signals to flow from radiating elements 18 to detector 60 when radiating elements 18 function as receivers. In some embodiments, signals may flow from source 12 to one or more radiating elements 18, functioning as transmitters, while signals flow from one or more other radiating elements 18, functioning as receivers, to detector 60. Additionally, the directional and/or bi-directional coupler may be further configured to measure the power of a flowing signal. In some embodiments, detector 60 may also include other types of circuits that measure the voltage and/or current of a flowing signal.

Figure 2:
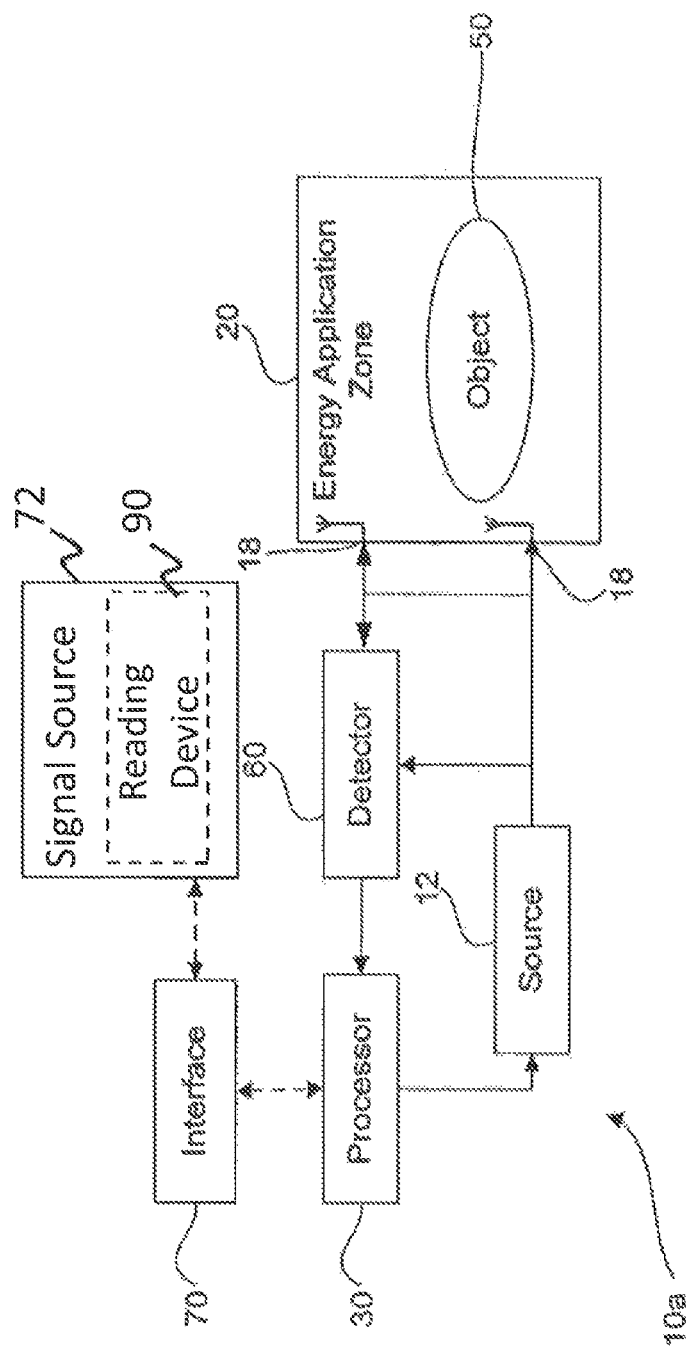
FIG. 2 is a diagrammatic representation of an apparatus for applying electromagnetic energy to an object, in accordance with an exemplary embodiment.

In some embodiments, processor 30 may also be configured to determine or receive information from one or more interfaces 70, as illustrated in FIG. 2. In certain embodiments, interface 70 may include any conduit for transferring information to or from processor 30. Interface 70 may include, for example, wired or wireless communication paths for communicating with any number of components integral to apparatus 10a or remotely located with respect to apparatus 10a. In some embodiments, interface 70 may be configured to receive information via any appropriate wire-based or wireless communication protocol. For example, interface 70 may be configured to receive information wirelessly, e.g., via radio frequency, infrared, microwave, Wi-Fi, and/or Bluetooth signal transmissions. In some embodiments, interface 70 may include one or more components for interrogating matter located in energy application zone 20, including object 50.

In some embodiments, interface 70 may be configured to receive signals from any device or system capable of generating signals for use by processor 30. For example, as shown in FIG. 2, interface 70 may be configured to send or receive signals from a signal source 72. In some embodiments signal source 72 may include a man-machine interface device (e.g., a graphical user interface, command line interface, touch user interface, voice user interface, etc., and any combinations thereof). Alternatively or additionally, signal source 72 may include a reading device 90 configured to receive operational information from a machine readable element. For example, such a reading device 90 may be configured to read information associated with, encoded on or otherwise stored in/on a machine readable element, e.g., an RFID tag and/or a barcode, or any other element capable of storing or including information. Signal source 72 may include an imaging device configured to provide image information associated with object 50 and/or energy application zone 20. In certain embodiments, such imaging information may include image data associated with optical indicia associated with object 50. Signal source 72 may also include one or more detecting units associated with energy application zone 20. Such detecting units may include, for example, scales for determining a weight associated with object 50, temperature detectors for determining a temperature associated with object 50 or other area of energy application zone 20, or any other appropriate or desired feedback device.

In some embodiments, processor 30 may be configured to determine or receive from interface 70 certain types of operational information. In some embodiments, the operational information may include a value indicative of a preliminary or target amount of energy to dissipate in object 50 (e.g., an uncorrected amount of energy to dissipate in object 50 to achieve a desired result). Further, in some embodiments, the operational information may relate to characteristics of object 50. For example, operational information may include information regarding the size (e.g., mass, volume), shape (e.g., cylindrical, rectangular), and/or state (e.g., solid, liquid, gas) of object 50. Operational information may also include information relating to material properties of object 50, such as, for example, a material type (e.g., type of food to be cooked), a material density, and/or material specific heat capacity (or other energy uptake coefficients). Further, in some embodiments, operational information may include temperature values, including, for example, a current temperature (e.g., internal, surface) of object 50 or a recommended storage temperature (e.g., conventional food storage temperatures, i.e., frozen, refrigerated, or room temperature). In some embodiments, operational information may also include information regarding one or more target characteristics object 50 is to have subsequent to delivery of energy to energy application zone 20, i.e., properties of the object post-energy delivery. Properties of the object post-energy delivery may include, for example, a desired temperature (e.g., internal, surface), a desired resiliency, a desired state of matter (e.g., solid, liquid, gas), and/or a desired size (e.g., mass, volume, dimensions, etc.).

Processor 30 may be configured to regulate the amount of energy delivered by source 12 to energy application zone 20. For example, processor 30 may be configured to control an amount of power supplied by source 12, an amount of time that power is supplied by source 12, or both.

In some embodiments, processor 30 may be configured to supply and/or adjust a power level or time of energy application for one or more modulation space elements in a modulation space. As used herein, the term "modulation space" or "MS" is used to collectively refer to all the parameters that may affect a field pattern in energy application zone 20 and all combinations thereof. In some embodiments, the MS may include all possible components that may be used and their potential settings (either absolute or relative to others) and adjustable parameters associated with the components. For example, the MS may include a plurality of variable parameters, the number of radiating elements 18, their positioning and/or orientation (if modifiable), the useable bandwidth, a set of all useable frequencies and any combinations thereof, power settings, time settings, phases, etc. The MS may have any number of possible variable parameters, ranging between one parameter only (e.g., a one dimensional MS limited to frequency only or phase only—or other single parameter), two or more dimensions (e.g., varying frequency and phase together within the same MS), or many more.

The term "modulation space element" or "MSE" may refer to a specific set of values of the variable parameters in MS. Therefore, the MS may also be considered to be a collection of all possible MSEs. For example, two MSEs may differ one from another in the relative amplitudes of the energy being supplied to a plurality of radiating elements. Sequentially swept MSEs may not necessarily be related to each other. Rather, their MSE variables may differ significantly from MSE to MSE (or may be logically related). In some embodiments, the MSE variables may differ significantly from MSE to MSE, possibly with little or no logical relation among them, however in the aggregate, a group of working MSEs may achieve a desired energy application goal.

In certain embodiments, processor 30 may be configured to supply and/or adjust a power level or time of energy application for each of a plurality of MSEs. For example, the power level or time of energy application can be set and/or adjusted for each of a plurality of frequencies (e.g., within a frequency band). Similarly, power level or time of energy application can be set and/or adjusted for each of a plurality of phases. Further, processor 30 may be configured to supply and/or adjust a power level or time of energy application for each of a plurality of frequency and phase combinations.

In certain embodiments, processor 30 may be configured to determine a value indicative of energy absorbable by object 50 at each of a plurality of MSEs. This may occur using one or more lookup tables, by pre-programming processor 30 or memory associated with processor 30, and/or by testing object 50 in energy application zone 20 to determine its absorbable energy characteristics. One exemplary way to conduct such a test is through a sweep.

As used herein, the word "sweep" includes, for example, the transmission over time of more than one MSE. For example, a sweep may include the sequential transmission of multiple MSEs in a contiguous MSE band; the sequential transmission of multiple MSEs in more than one non-contiguous MSE band; the sequential transmission of individual non-contiguous MSEs; and/or the transmission of synthesized pulses having a desired MSE/power spectral content (i.e. a synthesized pulse in time). Thus, during a MSE sweeping process, processor 30 may regulate the energy supplied to radiating elements 18 to sequentially transfer electromagnetic energy at various MSEs to energy application zone 20 and to receive feedback which serves as an indicator of the energy absorbable by object 50. While the disclosure is not limited to any particular measure of feedback indicative of energy absorption in object 50, various exemplary indicative values are discussed below.

During the sweeping process, processor 30 may receive information regarding measured electromagnetic energy reflected and/or coupled at radiating elements 18. Processor 30 may determine a value indicative of energy absorbable by object 50 at each of a plurality of MSEs based on the received information. Consistent with the presently disclosed embodiments, a value indicative of the absorbable energy may be a dissipation ratio (referred to herein as "DR") associated with each of a plurality of MSEs. As referred to herein, a "dissipation ratio," also known as "absorption efficiency" or "power efficiency," may be defined as a ratio between electromagnetic energy absorbed by object 50 and electromagnetic energy supplied into energy application zone 20.

Energy that may be dissipated or absorbed by object 50 is referred to herein as "absorbable energy." Absorbable energy may be an indicator of object 50's capacity to absorb energy or the ability of apparatus 10 to cause energy to dissipate in a given object 50. In the presently disclosed embodiments, absorbable energy may be calculated as a product of the maximum incident energy supplied to radiating elements 18 and the dissipation ratio. Reflected energy (i.e., the energy not absorbed or transmitted) may, for example, be a value indicative of energy absorbed by object 50. By way of another example, processor 30 might calculate or estimate absorbable energy based on the portion of the incident energy that is reflected and the portion that is transmitted. That estimate or calculation may serve as a value indicative of absorbed energy.

During an MSE sweep, for example, processor 30 might be configured to control source 12 such that energy is sequentially supplied to object 50 at a series of MSEs. The processor 30 might then receive a signal indicative of energy reflected at each MSE, and optionally also a signal indicative of the energy transmitted to other radiating elements 18. Using a known amount of incident energy supplied to radiating elements 18 and a known amount of energy reflected and/or transmitted (i.e., thereby indicating an amount absorbed at each MSE) an absorbable energy indicator might be calculated or estimated. Or, processor 30 might simply rely on an indicator of reflection as a value indicative of absorbable energy.

Absorbable energy may also include energy that may be dissipated by the structures of energy application zone 20 in which object 50 is located. Because absorption in metallic or conducting material (e.g., cavity walls or elements within a cavity) is characterized by a large quality factor (also known as a "Q factor"), such MSEs may be identified as being coupled to conducting material, and at times, a choice may be made not to transfer energy in such sub bands. In that case, the amount of electromagnetic energy absorbed in the structures of energy application zone 20 may be substantially small.

In the presently disclosed embodiments, a dissipation ratio may be calculated using formula (1):

$$DR=(P_{in}-P_{rf}-P_{cp})/P_{in} \qquad (1)$$

where $P_{in}$ represents the electromagnetic energy supplied into energy application zone 20 by radiating elements 18, $P_{rf}$ represents the electromagnetic energy reflected/returned at those radiating elements 18 that function as transmitters, and $P_{cp}$ represents the electromagnetic energy coupled at those radiating elements 18 that function as receivers. DR may be a value between 0 and 1, and, in the presently disclosed embodiments, may be represented by a percentage number.

The value indicative of the absorbable energy may further involve the maximum incident energy associated with apparatus 10 at the given MSE. As referred to herein, a "maximum incident energy" may be defined as the maximal power that may be provided to radiating elements 18 at a given MSE throughout a given period of time. Thus, one alternative value indicative of absorbable energy may be the product of the maximum incident energy and the dissipation ratio. These are just two examples of values that may be indicative of absorbable energy which could be used alone or together as part of control schemes implemented. Alternative indicia of absorbable energy may be used, depending on the structure employed and the application.

In certain embodiments, processor 30 may also be configured to cause energy to be supplied to radiating elements 18 in at least a subset of the plurality of MSEs, wherein energy transferred to energy application zone 20 at each of the subset of MSEs may be a function of the absorbable energy value at each MSE. For example, the energy supplied to radiating elements 18 at each of the subset of MSEs may be determined as a function of the absorbable energy value at each MSE (e.g., as a function of a dissipation ratio, maximum incident energy, a combination of the dissipation ratio and the maximum incident energy, or some other indicator). In the presently disclosed embodiments, this may occur as the result of absorbable energy feedback obtained during a MSE sweep. That is, using this absorbable energy information, processor 30 may adjust energy supplied at each MSE such that the energy at a particular MSE may in some way be a function of an indicator of absorbable energy at that MSE. The functional correlation may vary depending upon application. For some applications where absorbable energy is relatively high, there may be a desire to have processor 30 implement a function that causes a relatively low supply of energy at each of the emitted MSEs. This may be desirable, for example when a more uniform energy distribution profile is desired across object 50.

For other applications, there may be a desire to have the at least one processor 30 implement a function that causes a relatively high supply of energy. This may be desirable to target specific areas of object 50 with higher absorbable energy profiles. For yet other applications, it may be desirable to customize the amount of energy supplied to a known or suspected energy absorption profile of object 50. In still other applications, a dynamic algorithm or a look up table can be applied to vary the energy applied as a function of at least absorbable energy and perhaps one or more other variables or characteristics. These are but a few examples of how energy transferred into energy application zone 20 at each of the subset of MSEs may be a function of the absorbable energy value at each MSE. The disclosure is not limited to any particular scheme, but rather may encompass any technique for controlling the energy supplied by taking into account an indicator of absorbable energy.

In certain embodiments, the energy supplied to radiating elements 18 at each of the subset of MSEs may be a function of the absorbable energy values at the plurality of MSEs other than the MSE at which energy is supplied. For example, in the presently disclosed embodiments, the dissipation ratios at a range of "neighborhood" frequencies around the frequency at issue may be used for determining the amount of energy to be supplied. In the presently disclosed embodiments, the entire working band excluding certain frequencies that are associated with extremely low dissipation ratios (which may be associated with metallic materials, for example) may be used for the determination.

In certain embodiments, processor 30 may be configured to cause energy to be supplied to radiating elements 18 in at least a subset of the plurality of MSEs, wherein energy transferred to energy application zone 20 at each of the subset of MSEs is inversely related to the absorbable energy value at each MSE. Such an inverse relationship may involve a general trend—when an indicator of absorbable energy in a particular MSE subset (i.e., one or more MSEs) tends to be relatively high, the actual incident energy at that MSE subset may be relatively low. And when an indicator of absorbable energy in a particular MSE subset tends to be relatively low, the incident energy may be relatively high. The inverse relationship may be even more closely correlated. For example, in some of the presently disclosed embodiments, the incident energy may be set such that its product with the absorbable energy value (i.e., the absorbable energy by object 50) is substantially constant across the MSEs applied. In either case, a plot of transferred energy vs. MSE may generally appear as a reverse image of a value indicative of absorption (e.g., dissipation ratio or a product of the dissipation ratio and the maximal incident power available at each transferred MSE).

In certain embodiments, processor 30 may be configured to adjust energy supplied such that when the energy supplied is plotted against an absorbable energy value over a range of frequencies, the two plots tend to mirror each other. In some of the presently disclosed embodiments, the two plots may be mirror images of each other. In the presently disclosed embodiments, the plots may not exactly mirror each other, but rather, have generally opposite slope directions, i.e., when the value corresponding to a particular frequency in one plot is relatively high, the value corresponding to the particular frequency in the other plot may be relatively low.

In some embodiments and depending on the particular application (e.g., in a thawing application), MSEs corresponding to a dissipation ratio below a predetermined threshold or within a certain predetermined range may be used such that certain materials in object 50 are selectively heated. For example, it is known that water has a dissipation ratio higher than non-water materials. Therefore, by applying energy at MSEs that correspond to low dissipation ratios, object 50 may be thawed without heating the water inside.

In some embodiments, additionally or alternatively to measuring the dissipation of each MSE, a loss profile of energy application zone 20 is acquired or created, and the energy is transferred to zone 20 in accordance with the loss profile. A loss profile is any representation of the spatial distribution of dielectric losses in energy application zone 20. In some embodiments, the energy is transferred such that, considering the loss profile, the energy absorbed (that is the product of the transmission by the loss) is similar to a target absorption distribution, for example, constant energy absorption over the entire volume of energy application zone 20.

In some embodiments that use dissipation ratio considerations, dissipation ratios (or absorption degrees) are grouped, for example, in three or more groups, and EM field patterns belonging to each group are transferred by a different energy transfer protocol. For example, in one or more of the groups, less energy is transferred over MSEs that are more highly dissipated, such that the dissipated energy is substantially uniform. Optionally, in one or more of the groups, energy is not transferred at all. Optionally, in one or more of the groups energy is transferred at constant energy across the group members. Optionally, in one or more of the groups, energy is transferred at constant durations across the group members. Optionally, in one or more of the groups, electromagnetic energy is transferred at maximum power. Maximum power can be, but is not necessarily, the same for all the group members.

Optionally, in some embodiments, the distribution of the field intensity produced in energy application zone 20 by each of a variety of transmissions is predetermined, and a sequence of transmissions is designed, such that the cumulative field intensity is most similar to a target distribution, which in some embodiments is a uniform distribution. Optionally, the transmissions are from two or more sources, and each of the transmissions in the sequence provides for the propagation of a single mode in energy application zone 20, allowing for simpler determination of a sequence that results in a target energy distribution. Optionally, the transmissions differ in frequency, phase difference between the waves created by the various sources, and/or amplitude differences between the waves created by the various sources. Optionally, each source transfers one MSE or a particular predetermined set of MSEs.

In some embodiments, processor 30 may be configured to regulate the amount of energy and/or power supplied by source 12 such that a particular amount of energy is dissipated in object 50. For example, processor 30 may be configured to cause source 12 to transfer, apply or supply energy to energy application zone 20 at least until a preliminary or target amount of energy has been dissipated in object 50. In some embodiments, processor 30 may utilize feedback from energy application zone 20 during the energy delivery process to accomplish this. For example, processor 30 may receive signals from detector 60 indicating the amount of energy returned from energy application zone 20 and the amount of energy supplied to energy application zone 20. Based on this information, processor 30 may calculate the amount of delivered energy (e.g., by subtracting returned energy from supplied energy). In some embodiments, the amount of delivered energy may correspond to the sum of the amount of energy dissipated in object 50 and the amount of energy lost to loss constituents. Thus, in the case where energy lost to loss constituents is very small, the amount of delivered energy may be approximately equal to the amount of energy dissipated in object 50. Utilizing such feedback, in some embodiments, processor 30 may be configured to cause source 12 to transfer energy to energy application zone 20 at least until the amount of delivered energy equals the preliminary or target amount of energy. In some embodiments, while energy transfer may be continued until the amount of delivered energy equals the preliminary or target amount of energy, energy transfer may be interrupted one or more times during the process to, for example, obtain feedback or other measurements, such as, for example, measurement of a dissipation ratio.

In some embodiments, processor 30 may determine the preliminary or target amount of energy to dissipate in object 50 based on operational information received via interface 70. In certain embodiments, the operational information may specify the preliminary or target amount of energy to dissipate in object 50. For example, information stored and retrieved from a barcode or from an RFID tag and/or information input by a user through a man-machine interface may correspond to a particular amount of energy to dissipate in object 50.

Alternatively or additionally, processor 30 may be configured to determine the preliminary or target amount of energy to dissipate in object 50 based on operational information relating to characteristics of object 50. Processor 30 may account for various properties of object 50 (e.g., volume, shape, mass, material type, initial temperature, material state, or any other appropriate characteristic) in determining the preliminary or target amount of energy to be supplied to object 50. For example, processor 30 may be programmed to calculate the preliminary or target amount of energy to dissipate in object 50 for any of a plurality of material types based on the size (e.g., mass, volume, etc.) of object 50. For example, given operational information specifying a material type and a size of object 50, processor 30 may calculate a preliminary or target amount of energy to dissipate in object 50.

In some embodiments, processor 30 may calculate the preliminary or target amount of energy to dissipate in object 50 based on desired properties of object 50 post-energy delivery. By way of non-limiting examples, object 50 may include food, and desired properties of the object post-energy delivery may include, for example, final cooking state, final temperature, or final size (e.g., mass, volume, etc.). Thus, for example, given operational information specifying a food type, weight, initial temperature, and desired final temperature, processor 30 may calculate the preliminary or target amount of energy to dissipate in object 50 in order to heat the food to the desired final temperature. Similarly, in some embodiments, processor 30 may calculate the preliminary or target amount of energy to dissipate in object 50 in order to achieve a specified final cooking state based, for example, on operational information indicating the mass and specific heat capacity of the food (or any appropriate type of energy transfer coefficient).

The parameters processor 30 uses for calculating the preliminary or target amount of energy to dissipate in object 50 may be supplied by one or more of a number of sources. In some embodiments, signal source 72 may include a man-machine interface, and a user may enter one or more values. For example, the user may enter the amount of energy to dissipate in object 50. Alternatively, for an object 50 comprising food, the user may enter the food type, weight, and desired final cooking state. In some embodiments, signal source 72 may include an RFID tag/barcode reader, which may read parameter values from an RFID tag/barcode in, on, or associated with object 50. For example, an RFID tag/barcode may provide operational information including, for example, food type, food weight, and/or desired final cooking state.

In some embodiments, processor 30 may calculate a preliminary or target amount of energy to dissipate in object 50 based on values supplied by a combination of sources. For example, in just one of many possible exemplary combinations relating to an object 50 including one or more food items, a food type may be supplied by an RFID tag/barcode, a desired final cooking state may be entered by a user, and an initial temperature and a weight may be supplied by the output of detecting units.

While a relationship between energy delivery processing parameters and desired properties or characteristics of an object 50 may be generally understood, in some cases, application of a particular set of processing parameters to an energy application process may yield unintended results. For example, based on the unique interaction between a particular electromagnetic energy delivery device and a particular object, it may be possible that significantly more or significantly less energy than intended is absorbed by an object. Such variations can lead to unintended results of an electromagnetic energy transfer process (e.g., food that is overcooked or undercooked; materials that are under or over processed, etc.).

The efficiency of electromagnetic energy transfer to an object can vary based on the characteristics of an energy delivery device and based on how a particular energy delivery device interacts with a particular object or object type. A particular device's efficiency in transferring energy to an object can vary depending on the characteristics of the object, such as the composition, mass, and volume of the object. Different models of energy delivery devices may exhibit different energy transfer efficiencies. Different efficiencies can even be exhibited between particular devices of the same model, e.g., by virtue of manufacturing tolerances or the condition of a particular energy delivery device. Furthermore, the efficiency of a particular device may also change over time.

In some embodiments of the present disclosure, processor 30 may utilize calibration information to correct for variations in energy delivery characteristics. For example, in some embodiments, given a preliminary amount of energy to dissipate in object 50, processor 30 may be configured to determine a corrected amount of energy based on the preliminary amount of energy and calibration information. Accordingly, processor 30 may cause source 12 to transfer energy to energy application zone 20 at least until the amount of delivered energy equals the corrected amount of energy.

Energy delivery characteristics may include, for example, properties relating to an apparatus's ability to dissipate energy in an object, such as, for example, energy generation capabilities (e.g., power, frequency), energy transfer efficiency (e.g., efficiency in transferring power from source 12 to energy application zone 20), and sources of energy loss (e.g., loss constituents, as discussed above). In some embodiments, energy delivery characteristics may be unique to a particular apparatus or a particular class of apparatuses. Some energy delivery characteristics may be related to the physical properties of energy application zone 20 (e.g., shape, dimensions, etc.). Energy delivery characteristics may vary depending upon the particular object being processed.

In some embodiments, the calibration information may include, for example, at least one correction factor that at least partially accounts for energy delivery characteristics of apparatus 10 upon delivery of energy to one or more standard objects located in energy application zone 20. Such correction factors may be based on performance testing of apparatus 10 or of a similar apparatus with one or more standard objects. As used herein, a standard object can refer to any object with one or more known characteristics (e.g., shape, mass, volume, specific heat capacity, dissipation ratio). In some embodiments, standard objects may be objects specifically made for testing energy delivery characteristics of energy delivery devices. In other embodiments, standard objects may be common objects selected for use in testing energy delivery devices. For example, a standard object may comprise a common liquid container (e.g., cup, jar, beaker, etc.) containing a known volume of water. Standard objects may also include specific amounts of a particular type of food. For example, a standard object may comprise a particular amount of beef, chicken, fish, etc.

Performance testing may include, for example, operating apparatus 10 to transfer energy to energy application zone 20 with a standard object therein. The temperature change of the standard object resulting from the energy delivery process may be determined, and processor 30 may be configured to determine the amount of delivered energy ($E_{abs}$). As discussed above, apparatus 10 may determine $E_{abs}$ by subtracting the amount of energy returned from energy application zone 20 from the amount of energy delivered to energy application zone 20. Given the known properties of the standard object and its temperature change, the theoretical amount of energy absorbed by the standard object ($E_{theory}$) may be calculated. Then, a correction factor (F) for the apparatus 10 may be determined, where F is the ratio of $E_{abs}$ to $E_{theory}$ (i.e., $F=E_{abs}/E_{theory}$). Such a correction factor may then be stored in apparatus 10 as calibration information. Accordingly, in subsequent operation, when apparatus 10 determines that a preliminary amount of energy ($E_p$) is to be absorbed by an object 50, it may be configured to determine a corrected amount of energy to transfer by multiplying $E_p$ by correction factor F (i.e., corrected amount of energy=$E_p*F$) and then transfer energy until the amount of delivered energy equals the corrected amount of energy.

In some embodiments, this same calibration process may be used for multiple apparatuses, and each individual apparatus or apparatuses of the same design may be calibrated with one or more individual F values. By calibrating each apparatus with individual F values, each apparatus, given the same $E_p$, may dissipate the same amount of energy in similar objects even though each apparatus may receive feedback indicating different amounts of delivered energy.

Figure 3:
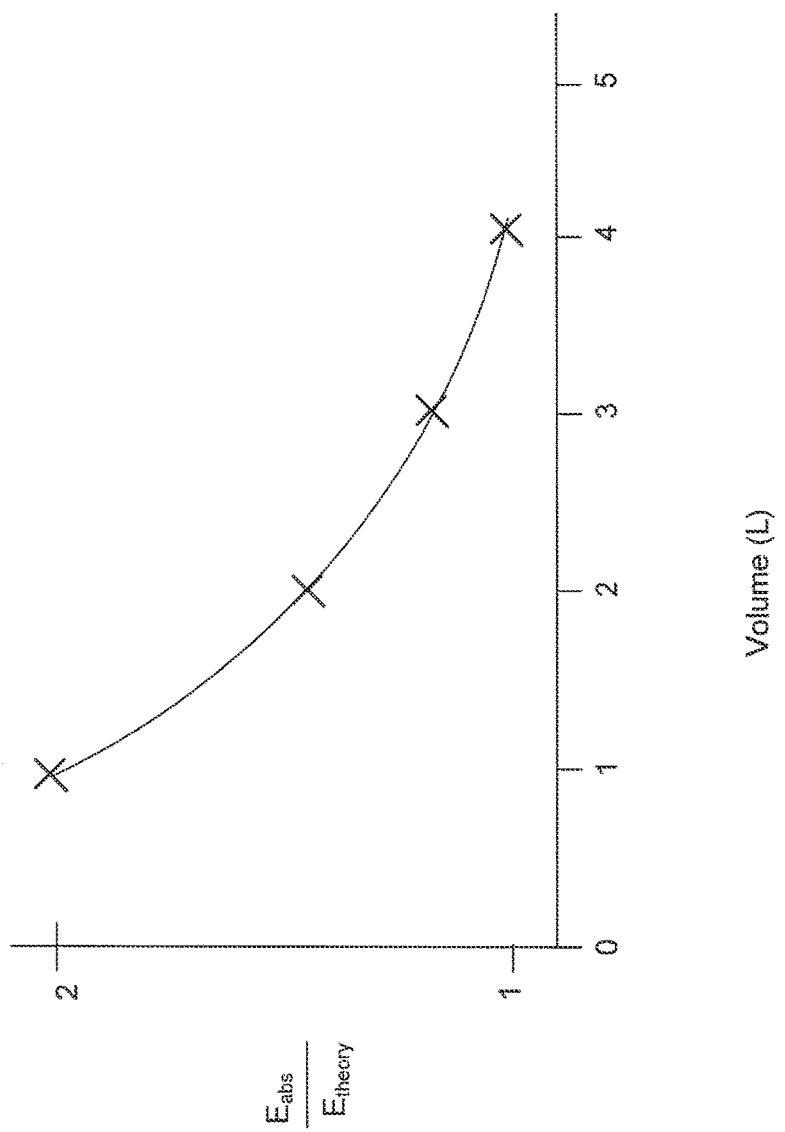
FIGS. 3-5 include exemplary calibration curves.

In some embodiments, energy delivery characteristics may be tested for a variety of different standard objects. For example, energy delivery characteristics may be tested for standard objects of a particular type over a range of sizes. For example, FIG. 3 illustrates an exemplary calibration curve for processing jars containing a range of volumes of water. Here the abscissa (y value) represents the determined correction factor corresponding to the particular volumes of water. As depicted, the amount of delivered energy determined by the apparatus is substantially equal to the calculated theoretical amount of energy for a jar containing about 4 liters of water. But for jars holding smaller volumes of water, the amount of delivered energy determined by the apparatus is more than the calculated theoretical value.

In some embodiments, energy delivery characteristics may be tested for a plurality of types and compositions of standard objects over a range of sizes. For example, in some embodiments, energy delivery characteristics may be tested for each of several different food types over a range of weights and/or volumes of the food. In certain embodiments, tests for numerous standard object types and sizes may be executed to generate a detailed performance characteristic mapping of an apparatus or class of apparatuses. Alternatively or additionally, energy delivery characteristics may be tested for standard objects over a range of sizes, masses or volumes of a constituent of the standard object. For example, a standard object may include a salt constituent, and energy delivery characteristics may be tested for a range of masses of the salt constituent. Similarly, a standard object may include a water constituent, and energy delivery characteristics may be tested for a range of volumes of the water constituent. For example, standard objects may include salt solutions of various concentrations, and energy delivery characteristics may be tested for several such solutions.

Calibration information may be stored in any form and location accessible by processor 30. For example, in some embodiments, calibration information 80 may comprise one or more lookup tables, calibration curves, and/or mathematical formulas. In certain embodiments, calibration information 80 may be stored locally in a particular apparatus 10. In other embodiments, calibration information 80 may be stored remotely. For example, in some embodiments, apparatus 10 may be configured to obtain calibration information via the Internet.

In some embodiments, calibration information may be generated for each apparatus 10 at the time apparatus 10 is manufactured. Alternatively, the calibration information may be generated for a class of apparatuses based the average performance characteristics of that class. The calibration information for a class of apparatuses can be stored locally in each apparatus of that class at the time of manufacture. Alternatively, calibration information for a class can be updated on the fly when the device is in use. For example, new calibration information based on testing of the class for new objects (e.g., new types, new sizes, etc.) may be generated after a particular apparatus was manufactured, and the new calibration information may be accessed by or pushed to the apparatus via, e.g., the Internet. In some embodiments, the calibration information may include information specific to one or more MSEs. In some embodiments, the calibration information may apply to all MSEs and may include information based on the average of MSE-specific calibration factors.

In some embodiments, processor 30 may select a correction factor source, e.g., lookup table, calibration curve, or mathematical formula (e.g., a polynomial approximation function), corresponding to a specific type of object 50 based on operational information identifying the object 50 type. For example, processor 30 may select one particular correction factor source for an object 50 that includes soup, and may select a different correction factor source for an object 50 that includes chicken, and may select a third for an object that includes both soup and chicken. After selecting an appropriate correction factor source, processor 30 may then determine the appropriate correction factor based on operational information identifying, for example, the mass and/or volume of object 50 and the chosen correction factor source. As discussed above, processor 30 may then determine a corrected amount of energy to transfer by multiplying the correction factor by the preliminary amount of energy and may transfer energy until the amount of delivered energy equals the corrected amount of energy.

Alternatively or additionally, the calibration information may include, for example, one or more values that correlate energy delivery characteristics of apparatus 10 to a benchmark apparatus. A benchmark apparatus may include an apparatus similar to apparatus 10, having known properties or energy delivery characteristics, to which the performance of apparatus 10 may be compared. The energy delivery characteristics of the benchmark apparatus may be predicted (e.g., by computer modeling) or may be empirically determined (e.g., by testing of the benchmark apparatus). For example, energy delivery characteristics may be tested when the benchmark apparatus has a substantially empty energy application zone 20 and/or when the benchmark apparatus has a standard object in energy application zone 20. In some embodiments, energy delivery characteristics may be determined for the benchmark apparatus by performance testing with standard objects as described above.

For example, in certain embodiments, apparatus 10 and the benchmark apparatus may comprise ovens, and the calibration information may correlate parameters for heating a particular object. In some embodiments, ovens may be calibrated with respect to a benchmark oven for baking a loaf of bread having particular parameters. For example, a loaf of bread having a given composition, size, and shape may be baked in a benchmark oven until the temperature inside the middle of the bread is about 95° C., and the amount of delivered energy ($E_{bench}$) determined by the benchmark oven may be obtained. A loaf of bread having similar properties may then be baked in ovens to be calibrated, and the temperature inside the bread may be monitored. When a measurement result indicates that the middle of the bread is about 95° C., the amount of delivered energy ($E_{abs}$) determined by each of the ovens to be calibrated may be obtained. Then a correction factor (F) may be determined for each oven to be calibrated by the equation $F=E_{abs}/E_{bench}$, and the correction factors may be stored in the ovens as calibration information. In future operation, a calibrated oven can receive a preliminary amount of energy to dissipate in a loaf of bread to be cooked that corresponds to the amount of delivered energy the benchmark oven determined when it cooked a similar loaf. Then the calibrated oven can determine the corrected amount of energy it should transfer to cook the loaf by multiplying the preliminary amount of energy by the stored correction factor. Accordingly, even though the exact amount of energy dissipated in the bread may be unknown, the calibrated oven may dissipate the same amount of energy in the bread as the benchmark oven.

Figure 4:
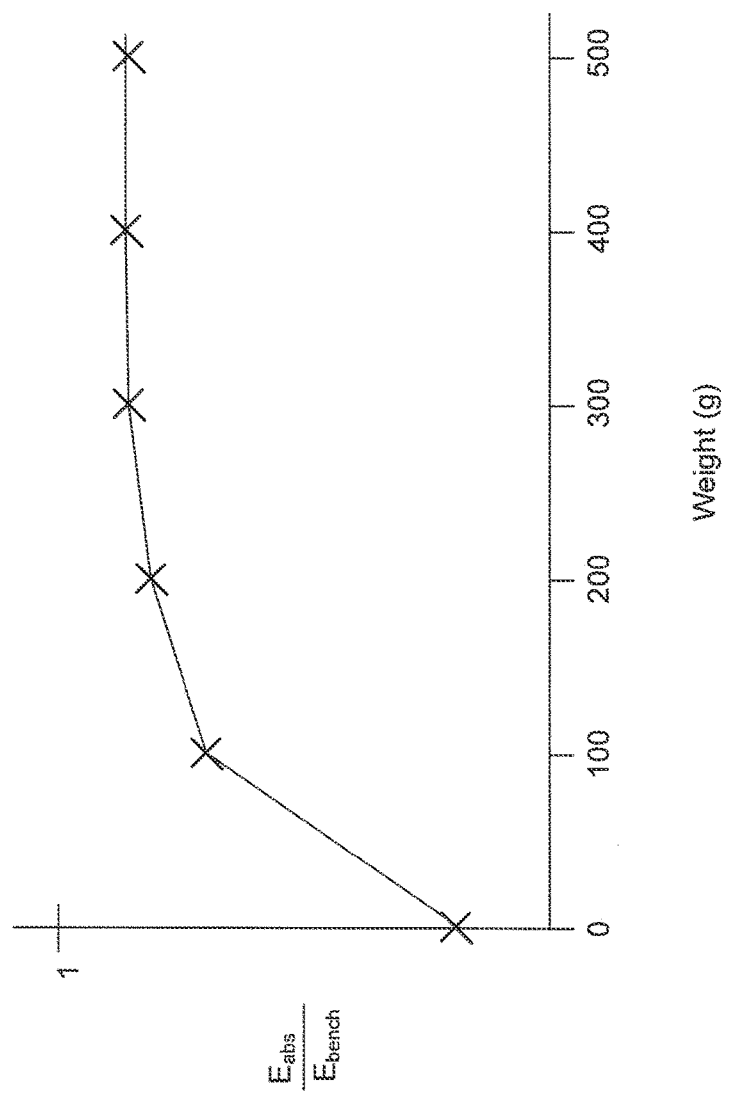
Figure 5:
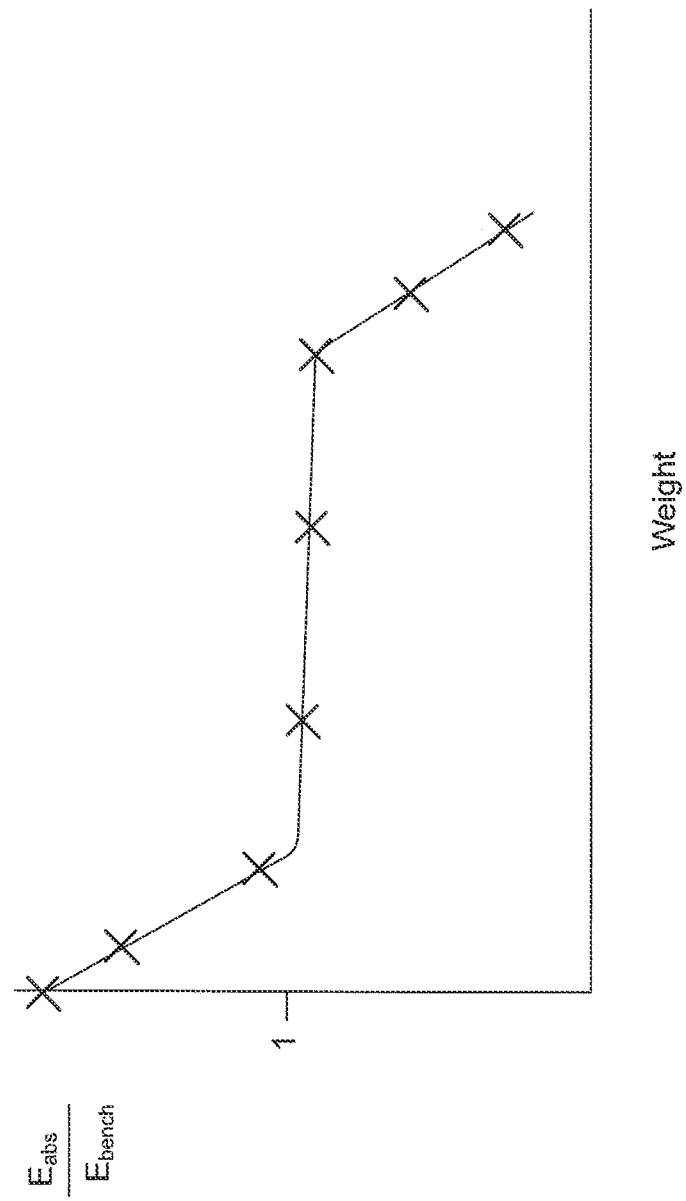

Differences in a particular apparatus's ability to dissipate energy in object 50 as compared to a benchmark apparatus's ability to dissipate energy in object 50 may result from, for example, energy loss constituents that are specific to each apparatus, and the differences may vary depending on the object 50 type and the object 50 size. Accordingly, in some embodiments, energy delivery characteristics may be tested for each of a plurality of types of objects over a range of sizes. For example, FIG. 4 illustrates an exemplary calibration curve for an oven calibrated against a benchmark oven. In this example, the abscissa represents a ratio of the delivered energy determined by the oven to be calibrated ($E_{abs}$) to the delivered energy determined by the benchmark oven ($E_{bench}$) when pieces of beef over a range of weights are heated to the same temperature in each oven. As depicted in FIG. 4, when the ovens are operated substantially empty (i.e., zero beef in energy application zone 20), the ratio is about 0.2. This signifies that the oven to be calibrated has smaller losses than the benchmark oven when both are substantially empty. For 100 g of beef, the oven to be calibrated is more similar to the benchmark oven, and with larger amounts of beef, the behavior of the oven to be calibrated approaches that of the benchmark oven. FIG. 5 illustrates another exemplary calibration curve. In this example, it can be seen that the losses of the oven to be calibrated are larger than those of the benchmark oven with objects of smaller weight, are smaller than those of the benchmark oven with objects of larger weight, and are about the same with objects of intermediate weights.

In some embodiments, processor 30 may be configured to regulate energy delivery based on real-time estimation of the amount of energy dissipated in object 50. For example, in certain embodiments, processor 30 may be configured to determine an estimated amount of energy dissipated in object 50 based on calibration information, the amount of energy returned from energy application zone 20, and the amount of energy supplied to energy application zone 20. Utilizing the estimated amount of energy dissipated in object 50, processor 30 may be configured to cause source 12 to transfer energy to energy application zone 20 at least until the estimated amount of energy equals the target amount of energy to dissipate in object 50.

In some embodiments, the calibration information may include an indicator of the amount of power consumed by loss constituents associated with apparatus 10 when energy is supplied by source 12 to a substantially empty energy application zone 20. For example, apparatus 10 may be operated to transfer power to energy application zone 20 for a period of time when no object is located inside energy application zone 20. The amount of energy delivered to energy application zone 20 and the amount of energy returned from energy application zone 20 may be determined by processor 30. By subtracting the amount of energy returned from the amount of energy delivered, and considering the elapsed time, a value indicative of an amount of power consumed by loss constituents may be determined. This value of the amount of power consumed by loss constituents may then be stored as calibration information in apparatus 10, for use in subsequent energy delivery processes.

In certain embodiments, calibration information comprising the amount of power consumed, dissipated, attenuated, etc. by loss constituents may be utilized to determine an estimate of the amount of energy dissipated in object 50. For example, during delivery of energy to energy application zone 20, processor 30 may receive information indicating the amount of power supplied to energy application zone 20 and the amount of power returned from energy application zone 20. Processor 30 may then be configured to determine the estimated amount of power consumed by object 50 by subtracting the amount of power returned from energy application zone 20 and the amount of power consumed by loss constituents from the amount of power supplied to energy application zone 20. Then processor 30 may determine a real-time estimation of the total amount of energy dissipated in object 50 based on the estimated amount of power being consumed by object 50 and the length of time energy has been applied to object 50.

In certain embodiments, processor 30 may be configured to modify energy delivery based on primary and secondary calibration information. The primary and secondary calibration information may be considered each at a different stage. For example, if energy transfer is controlled based on comparison between a target amount of energy and an estimated amount of energy, one of the primary and secondary calibration information may be considered in determining the target energy, and the other in determining the estimated energy. In some embodiments, each of the primary and secondary calibration information is used only once, for example, if the secondary calibration information is used for determining the target amount of energy it will not be used for determining the estimated amount of energy.

For example, processor 30 may determine a preliminary amount of energy to dissipate in object 50 based on operational information, as disused above. Processor 30 may then determine a target amount of energy to transfer based on the preliminary amount of energy and secondary calibration information. Processor 30 may cause source 12 to transfer energy to energy application zone 20 at least until an estimated amount of energy dissipated in object 50 equals the determined target amount of energy. The estimated amount of energy may be determined based on primary calibration information, an amount of energy returned from energy application zone 20, and an amount of energy supplied to the energy application zone 20.

In some embodiments, the primary calibration information may include, for example, an indicator of the amount of power consumed by loss constituents associated with apparatus 10 when energy is supplied by source 12 to a substantially empty energy application zone 20.

In some embodiments, the secondary calibration information may include, for example, a correction factor that at least partially accounts for performance attributes of apparatus 10 upon delivery of energy to one or more standard objects or a value that correlates energy delivery characteristics of apparatus 10 to energy delivery characteristics of a benchmark apparatus.

In some embodiments, apparatus 10 may be configured to perform a selftest to determine at least a portion of the calibration information. For example, apparatus 10 may be configured to supply electromagnetic radiation to an energy application zone 20 containing a standard object or to a substantially empty energy application zone 20, and determine current energy delivery characteristics of apparatus 10. In some embodiments, the self test may include supplying a plurality of MSEs and evaluating the oven's energy delivery characteristics in each of the MSEs.

For example, in some embodiments, processor 30 may be configured to execute a selftest by causing source 12 to transfer energy to energy application zone 20 for a particular length of time when no object is located in energy application zone 20. Processor 30 may be configured to determine the amount of power delivered to energy application zone 20 and the amount of power returned from energy application zone 20 during the selftest. Processor 30 may further be configured to determine a value indicative of the amount of power consumed, dissipated, attenuated, etc. by loss constituents of the empty energy application zone by subtracting the amount of power returned from the amount of power delivered. This value of the amount of power consumed by loss constituents may then be stored as calibration information in apparatus 10, for use in subsequent energy delivery processes.

In some embodiments, a selftest may comprise a performance test, as described above, when energy application zone 20 contains a standard object. In some embodiments, a standard object may be associated with one or more machine-readable tags that can signal processor 30 to perform a selftest. For example, in some embodiments, a machine-readable element may be fixed in or on a standard object, and when the standard object is placed in energy application zone 20, it may trigger processor 30 to perform a selftest.

In some embodiments, a selftest may involve positioning a standard object at a specific location and/or in a specific orientation within energy application zone 20. In some embodiments, energy application zone 20 and/or the standard object may include positioning elements to aid in positioning the standard object within energy application zone 20. Positioning elements may include, for example, markings, protrusions, and/or recessions. A standard object may comprise, for example, a standard 1 liter water jar. Optionally, the standard jar may have a recession at its bottom, and energy application zone 20 may contain a tray with a protrusion that fits the recession. Thus, fitting the protrusion to the recession fits the jar in a predetermined position and orientation in energy application zone 20.

In some embodiments, the machine-readable tags associated with the standard objects may carry information regarding the processing of the standard object. For example, the machine-readable tags may carry processing instructions such as a length of time and/or a power level for energy delivery, for example, at each MSE, and/or a target temperature change or final temperature of the standard object that the processing should achieve. In some embodiments, the machine-readable tags may also carry information such as the theoretical amount of energy ($E_{theory}$) necessary to achieve the standard object temperature change associated with the selftest. In other embodiments, the machine-readable tags may also carry information such as the amount of energy that a benchmark apparatus determined as delivered from the energy application zone upon processing the standard object ($E_{bench}$) according to the same parameters.

In some embodiments, a kit for calibrating an energy delivery device may be provided. Such a kit may include, for example, at least one standard object and information regarding use of the at least one standard object to calibrate an energy delivery device. In some embodiments, the information, or at least a portion thereof, may be encoded on one or more machine-readable elements, such as, for example a RFID tag or a barcode. For example, a machine-readable element may be fixed in or on each standard object included in the kit. Alternatively or additionally, a machine-readable element may be associated with packaging configured to contain a plurality of standard objects. In some embodiments, the information may include instructions for using the standard objects to execute a selftest of an energy delivery device and/or information relating to properties of the standard objects and to determining calibration information based on a selftest using the standard objects. For example, the information may include processing instructions such as positioning and orientation guidelines, a length of time, a power level, and/or a target temperature change or final temperature, as discussed above. Additionally or alternatively, as discussed above, the information may include theoretical and/or benchmark values relating to use of the standard objects.

Processor 30 may be programmed to perform selftests at a variety of different times. For example, in some embodiments, a selftest may be performed each time apparatus 10 is powered on or powered off. Additionally or alternatively, processor 30 may perform a self test before or after each use. In some embodiments, processor 30 may prompt a user to execute a selftest.

In some embodiments, calibration information generated from a selftest may be based on comparing current energy delivery characteristics to theoretical energy delivery values or to energy delivery characteristics of a benchmark apparatus. For example, as discussed above, apparatus 10 may be configured to determine the amount of delivered energy ($E_{abs}$) upon execution of the selftest. Processor 30 may then determine calibration information by comparing the determined $E_{abs}$ to a theoretical value for the energy absorbed by the standard object. The theoretical value may be supplied by a machine-readable element associated with the standard object, as discussed above, or may be determined based on known characteristics of the standard object (e.g., size, specific heat capacity, and/or dissipation ratio). Alternatively or additionally, the determined $E_{abs}$ may be compared to the value a benchmark apparatus measured as delivered when supplying electromagnetic energy to the same or a similar standard object under similar operating parameters and a calibration factor based on this comparison may be determined.

In some embodiments, calibration information generated from the selftest may be based on comparing current energy delivery characteristics to past energy delivery characteristics. For example, processor 30 may be configured to compare currently measured values of incident, returned, reflected, transmitted, and/or delivered power to a baseline set of values obtained when apparatus 10 was new. Based on this comparison, processor 30 may generate additional calibration information that accounts for variation in the performance of apparatus 10 since apparatus 10 was new, such as, for example, since apparatus 10 was manufactured.

One or more factors can be responsible for a change in the energy transfer characteristics of apparatus 10. For example, in some cases, a change in the energy transfer characteristics may be the result of changes in the properties or capabilities of the elements of the apparatus 10 over time and/or after numerous uses. For example, partial wear of electrical contacts or elements may take place over time, and change properties or capabilities of the worn contacts or elements. Alternatively or additionally, the difference may result from a change in the loss constituents associated with the apparatus, such as, for example, a buildup of remnants from processing past objects. In some embodiments, the user is prompted to call a technician if differences between energy delivery characteristics of the device at present and those that the device had when it was new are larger than a specified threshold.

Figure 6:
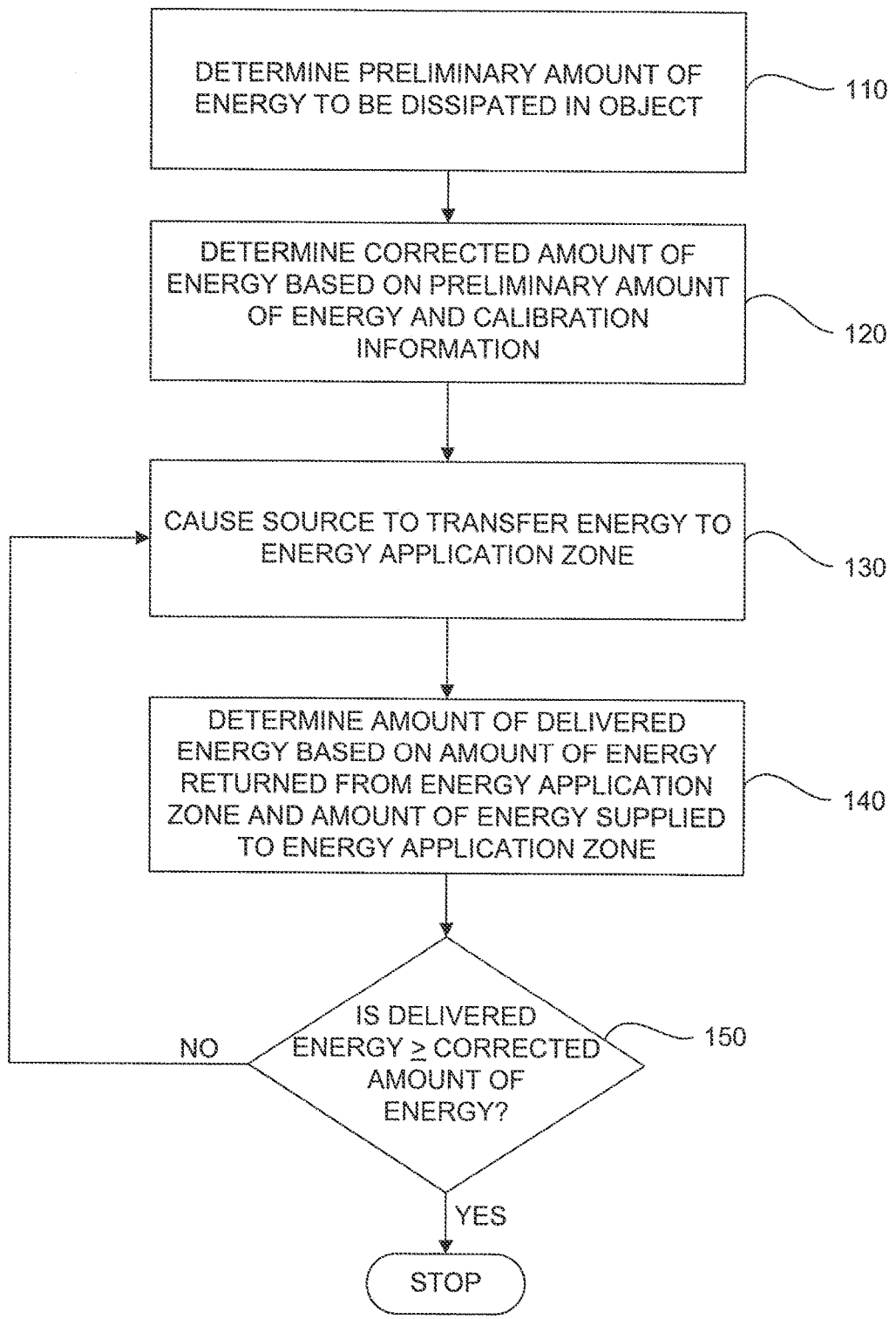
FIG. 6 is a flow chart of exemplary steps of applying electromagnetic energy to an object.

FIG. 6 depicts exemplary steps for operating an apparatus (such as, for example, apparatus 10 or 10*a* described above) for delivering electromagnetic energy to an energy application zone. A preliminary amount of energy to dissipate in an object located at least partially in the energy application zone may be determined (step 110). In some embodiments, this may include receiving operational information, as described above. Based on the preliminary amount of energy and on calibration information, a corrected amount of energy may be determined (step 120). As described above, the calibration information may, for example, account for energy delivery characteristics of the apparatus upon delivery of energy to one or more standard objects located in the energy application zone or for differences in energy delivery characteristics between an apparatus and a benchmark apparatus. Energy may be delivered to the energy application zone (step 130) and the amount of delivered energy may be determined (step 140). As described above, the amount of delivered energy may be determined based on the amount of energy returned from the energy application zone and the amount of energy supplied to the energy application zone. The amount of delivered energy may be compared to the corrected amount of energy (step 150), and energy application may be continued at least until the two are equal.

Figure 7:
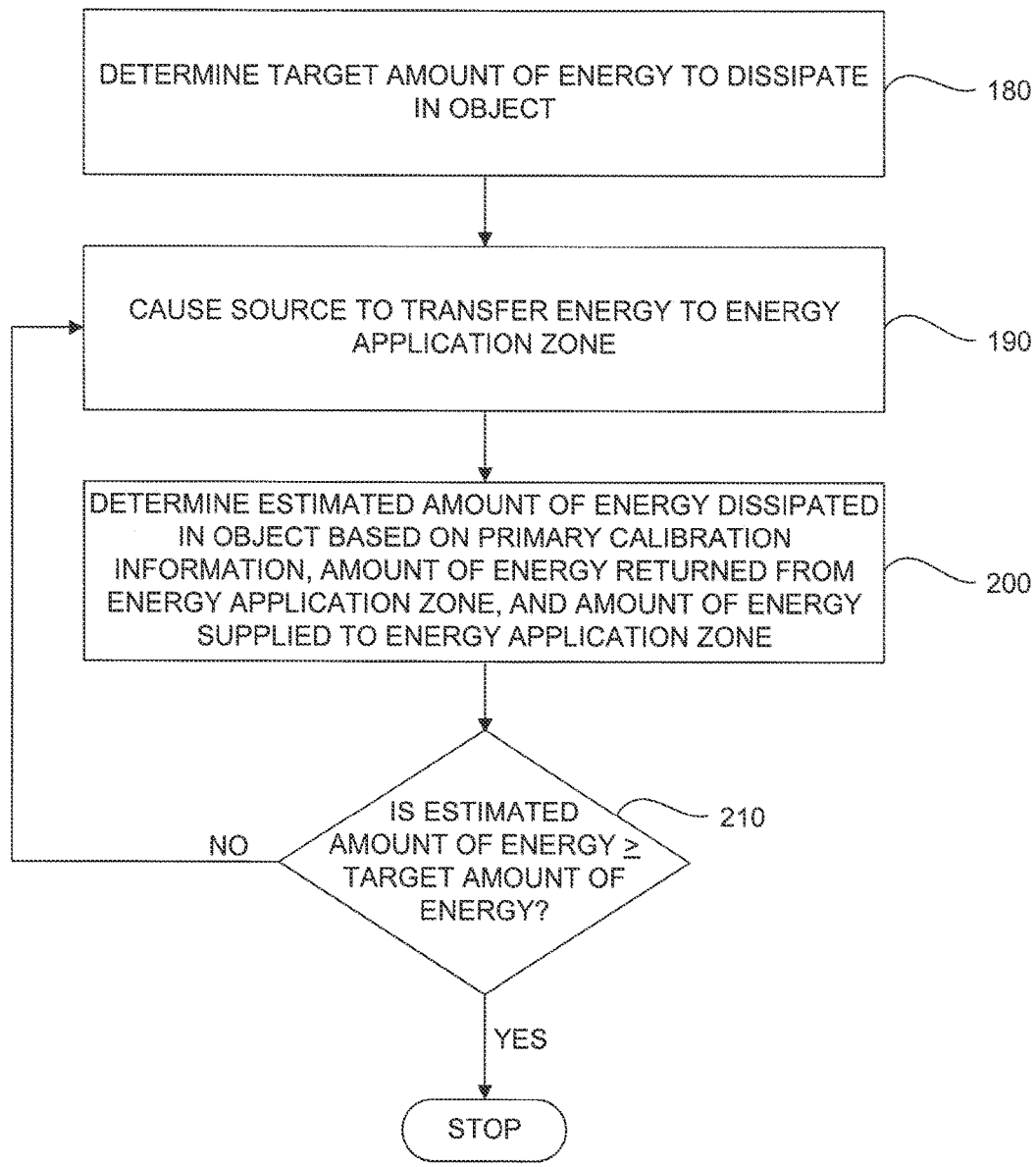
FIG. 7 is a flow chart of exemplary steps of applying electromagnetic energy to an object.

FIG. 7 depicts other exemplary steps for operating an apparatus for delivering electromagnetic energy to an energy application zone. A target amount of energy to dissipate in an object may be determined (step 180). As discussed above, in some embodiments, this may include receiving operational information related to the target amount. Energy delivery to the energy application zone may be commenced (step 190). An estimated amount of energy dissipated in the object may be determined (step 200). The estimated amount of energy may be determined based on primary calibration information, the amount of energy returned from the energy application zone, and the amount of energy supplied to the energy application zone. As discussed above, in some embodiments, the primary calibration information may include at least one indicator of an amount of power consumed by loss constituents associated with the apparatus when energy is supplied by the source to a substantially empty energy application zone. Energy delivery may continue at least until the estimated amount of energy equals the target amount of energy (step 210).

In the foregoing Description of Exemplary Embodiments, various features are grouped together in the described embodiments for purposes of streamlining the disclosure. This method of disclosure is not to be interpreted as reflecting an intention that any claim requires more features than are expressly recited in that claim. Rather, as the following claims reflect, inventive aspects lie in less than all features of a single foregoing disclosed embodiment. Thus, the following claims are hereby incorporated into this Description of the Exemplary Embodiments, with each claim standing on its own as a separate embodiment of the invention.

Moreover, it will be apparent to those skilled in the art from consideration of the specification and practice of embodiments of the present disclosure that various modifications and variations can be made to the disclosed systems and methods without departing from the scope of the claims. Thus, it is intended that the specification and examples be considered as exemplary only, with a true scope of the present disclosure being indicated by the following claims and their equivalents.

What is claimed is:

1. An apparatus for transferring electromagnetic energy to an energy application zone via a source of electromagnetic energy, the apparatus comprising:
    a processor configured to:
        determine a target amount of energy to be dissipated in an object located at least partially in the energy application zone;
        determine an estimated amount of energy that was dissipated in the object based on first calibration information pertaining to the apparatus, an amount of energy returned from the energy application zone, and an amount of energy supplied to the energy application zone; and
        cause the source to transfer energy to the energy application zone at least until the estimated amount of energy equals the target amount of energy.

2. The apparatus of claim 1, comprising a detector configured to detect the amount of energy returned from the energy application zone.

3. The apparatus of claim 1, wherein the first calibration information includes at least one indicator of an amount of power consumed by loss constituents associated with the apparatus when energy is supplied by the source to a substantially empty energy application zone.

4. The apparatus of claim 1, wherein the processor is configured to:
   determine a preliminary amount of energy to be dissipated in the object; and
   determine the target amount of energy based on the preliminary amount of energy and second calibration information.

5. The apparatus of claim 4, wherein the second calibration information includes at least one correction factor that at least partially accounts for energy delivery characteristics of the apparatus upon delivery of energy to one or more standard objects located in the energy application zone.

6. The apparatus of claim 4, wherein the second calibration information includes one or more values that correlate energy delivery characteristics of the apparatus to energy delivery characteristics of a benchmark apparatus.

7. The apparatus of claim 1, wherein the processor is configured to:
   execute a selftest of the apparatus; and
   determine at least a portion of the first calibration information based on the selftest.

8. The apparatus of claim 7, wherein the selftest comprises causing the source to transfer energy to the energy application zone when the energy application zone is substantially empty.

9. The apparatus of claim 8, wherein the selftest comprises determining an amount of power consumed by loss constituents associated with the apparatus, and wherein the processor is configured to determine at least a portion of the first calibration information based on the amount of power.

10. The apparatus of claim 1, wherein the first calibration information includes at least one correction factor that at least partially accounts for energy delivery characteristics of the apparatus upon delivery of energy to one or more standard objects located in the energy application zone.

11. The apparatus of claim 1, wherein the first calibration information comprises information specific to one or more modulation space elements (MSEs).

12. The apparatus of claim 1, wherein the first calibration information comprises information based on an average of modulation space element specific (MSE-specific) calibration factors.

13. A method of transferring electromagnetic energy to an energy application zone using an apparatus comprising a source of electromagnetic energy and a processor configured to perform the method comprising:
   determining a target amount of energy to be dissipated in an object located at least partially in the energy application zone;
   determining an estimated amount of energy that was dissipated in the object based on first calibration information pertaining to the apparatus, an amount of energy returned from the energy application zone, and an amount of energy supplied to the energy application zone; and
   causing the source to transfer energy to the energy application zone at least until the estimated amount of energy equals the target amount of energy.

14. The method of claim 13, wherein the first calibration information includes at least one indicator of an amount of power consumed by loss constituents associated with the apparatus when energy is supplied by the source to a substantially empty energy application zone.

15. The method of claim 13, comprising:
   determining a preliminary amount of energy to be dissipated in the object; and
   determining the target amount of energy based on the preliminary amount of energy and second calibration information.

16. The method of claim 15, wherein the second calibration information includes at least one correction factor that at least partially accounts for energy delivery characteristics of the apparatus upon delivery of energy to one or more standard objects located in the energy application zone.

17. The method of claim 15, wherein the second calibration information includes one or more values that correlate energy delivery characteristics of the apparatus to energy delivery characteristics of a benchmark apparatus.

18. The method of claim 13, comprising:
   executing a selftest of the apparatus; and
   determining at least a portion of the first calibration information based on the selftest.

19. The method of claim 18, wherein executing the selftest comprises causing the source to transfer energy to the energy application zone when the energy application zone is substantially empty.

20. The method of claim 19, wherein executing the selftest comprises determining an amount of power consumed by loss constituents associated with the apparatus, and wherein the processor is configured to determine at least a portion of the primary calibration information based on the amount of power.

* * * * *